US011501117B2

(12) United States Patent
Hidaka

(10) Patent No.: US 11,501,117 B2
(45) Date of Patent: Nov. 15, 2022

(54) CLASSIFICATION COMPUTER, CLASSIFICATION METHOD, AND RECORDING MEDIUM

(71) Applicant: NEC Corporation, Tokyo (JP)

(72) Inventor: Takeo Hidaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 405 days.

(21) Appl. No.: 16/738,066

(22) Filed: Jan. 9, 2020

(65) Prior Publication Data

US 2020/0302244 A1 Sep. 24, 2020

(30) Foreign Application Priority Data

Mar. 19, 2019 (JP) .............................. JP2019-050853

(51) Int. Cl.
| | |
|---|---|
| *G06K 9/62* | (2022.01) |
| *G01R 19/00* | (2006.01) |
| *G01R 19/25* | (2006.01) |
| *G01R 19/165* | (2006.01) |

(52) U.S. Cl.
CPC ....... *G06K 9/6268* (2013.01); *G01R 19/0092* (2013.01); *G01R 19/16528* (2013.01); *G01R 19/2506* (2013.01); *G06K 9/6215* (2013.01)

(58) Field of Classification Search
CPC .............. G06K 9/6268; G06K 9/6215; G06K 9/00536; G01R 19/0092; G01R 19/16528; G01R 19/2506; G01R 19/2513
See application file for complete search history.

(56) References Cited

U.S. PATENT DOCUMENTS

2016/0169977 A1* 6/2016 Fukuhara ........... G01R 31/3648
324/434

FOREIGN PATENT DOCUMENTS

JP 2013-218715 A 10/2013

OTHER PUBLICATIONS

"Clustering" by Toshihiro Kamishima, retrieved on Feb. 21, 2019, http://www.kamishima.net/archive/clustering.pdf, 64 pages total.

* cited by examiner

*Primary Examiner* — Farhana A Hoque
(74) *Attorney, Agent, or Firm* — Sughrue Mion, PLLC

(57) ABSTRACT

In order to classify a current waveform of current estimated to be supplied to the same electric instrument, even when an operation mode of an operating electric instrument is unknown, a classification computer includes: a first classification unit to perform first classification of each piece of set information by information being included in each piece of the set information being a combination of waveform information and on/off information, and representing a similarity degree of the waveform information; a second classification unit to perform second classification of each piece of the set information by information being included in each piece of the set information and representing a similarity degree of the on/off information; and a third classification unit to classify the set information by a classification result related to the first classification and the second classification.

10 Claims, 12 Drawing Sheets

Fig.4

SET INFORMATION DB

| SET NUMBER | 1 | 2 | 3 | 4 |
|---|---|---|---|---|
| FIRST ASSOCIATION INFORMATION | | | | |
| SECOND ASSOCIATION INFORMATION | | | | |
| THIRD ASSOCIATION INFORMATION | | | | |
| SET INFORMATION { WAVEFORM INFORMATION / ON/OFF INFORMATION } | | | | |

Fig.7

SET INFORMATION DB

| SET NUMBER | 1 | 2 | 3 | 4 |
|---|---|---|---|---|
| FIRST ASSOCIATION INFORMATION | 1 | 1 | 1 | |
| SECOND ASSOCIATION INFORMATION | 1 | 1 | 1 | |
| THIRD ASSOCIATION INFORMATION | 1 | | | |
| SET INFORMATION { WAVEFORM INFORMATION, ON/OFF INFORMATION } | | | | |

→ SET INFORMATION

Fig. 11
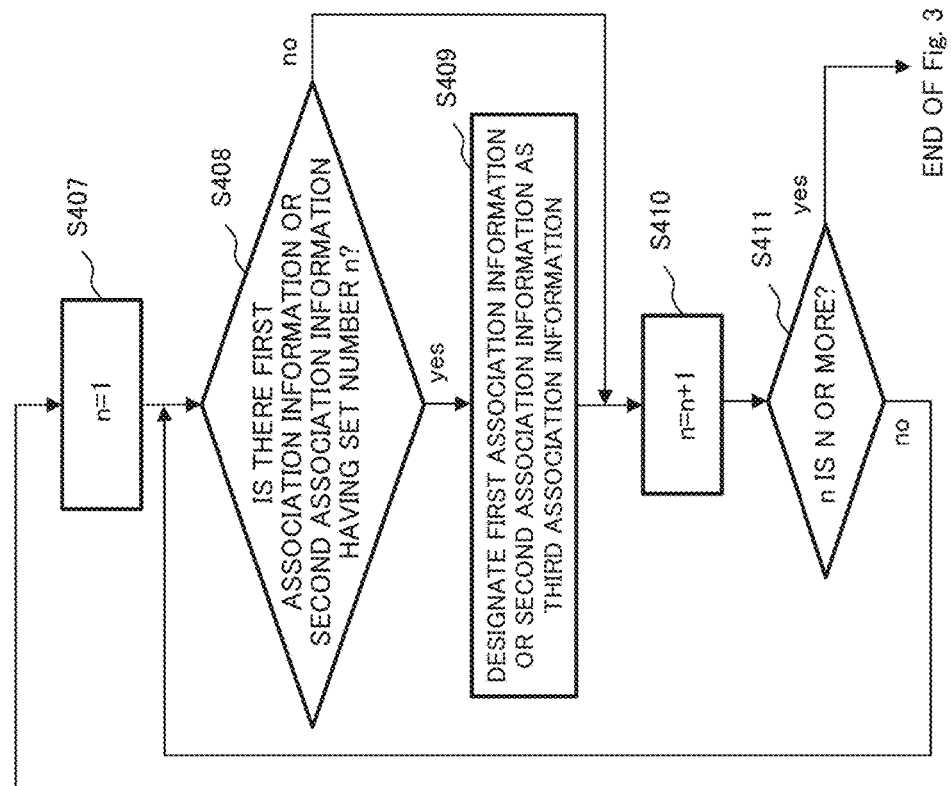
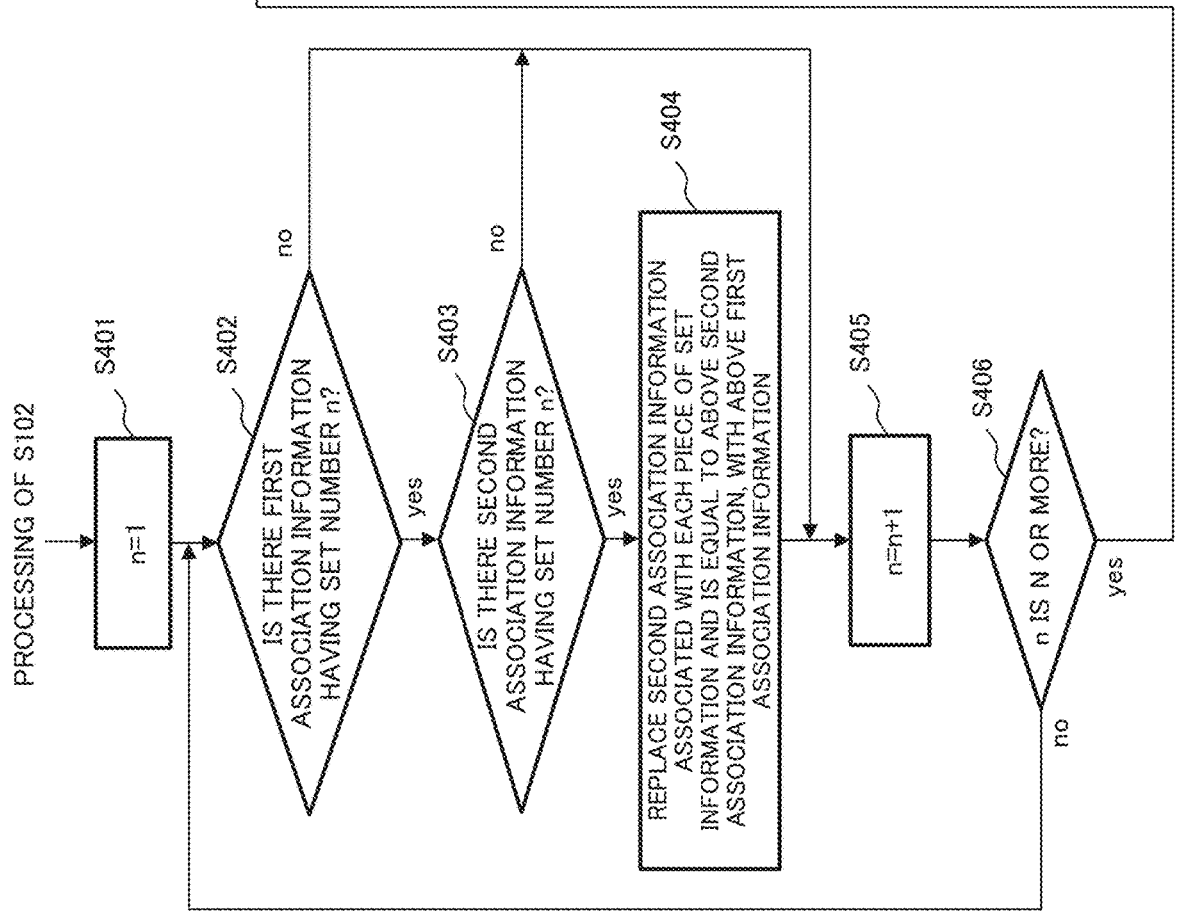

CLASSIFICATION COMPUTER, CLASSIFICATION METHOD, AND RECORDING MEDIUM

This application is based upon and claims the benefit of priority from Japanese Patent Application No. 2019-050853, filed on Mar. 19, 2019, the disclosure of which is incorporated herein in its entirety by reference.

TECHNICAL FIELD

The present invention relates to classification of current information.

BACKGROUND ART

As a method of monitoring a working status of an electric instrument provided in a household, a store, a factory, or the like, a method of monitoring by attaching a current measurement device to each electric instrument is conceivable. However, attaching a current measurement device to each electric instrument leads to a heavy load on an operator, and high cost.

As a technique for solving this problem, a nonintrusive load monitoring (NILM) technique is known (see BACKGROUND ART in PTL 1). Herein, PTL 1 is Japanese Unexamined Patent Application Publication No. 2013-218715. The NILM technique is a technique of estimating an operation of each subordinate electric instrument by measuring and analyzing a current waveform of supply current in a supply source of an electric instrument such as a switchboard or a cubicle. The technique separates a supplied current waveform into a characteristic current waveform synthesized in the supplied current waveform, or estimates an operation state (on/off information) for each separated current waveform. Thus, the NILM technique enables a working status of each electric instrument to be checked without attaching a current measurement device to each electric instrument.

However, the NILM technique separates a current waveform by a characteristic of a current waveform. Thus, even the same electric instrument is separated into another current waveform when having a different characteristic of a current waveform. A reason that even the same electric instrument produces a plurality of current waveforms is that, for example, different parts of a consumption current waveform of the same electric instrument may operate at the same timing. Thus, in order to accurately monitor an operating status of each electric instrument by the NILM technique, it is required to estimate which combination of a plurality of separated current waveforms represents a current waveform for the same electric instrument.

There is a method disclosed by PTL 1, as a technique for estimating a current waveform by the same electric instrument in a current waveform separated by the NILM technique. The method disclosed by PTL 1 estimates that a plurality of current waveforms are current waveforms output from the same electric instrument, in accordance with a necessary condition and a clue condition derived based on an operation mode of an electric instrument found in advance.

The operation mode is, for example, difference in intensity of air blow from a fan being an electric instrument. For example, it is assumed that an operation mode of a fan has three stages "stop", "weak", and "strong". In this case, the method disclosed by PTL 1 derives a necessary condition that all current waveforms are off during "stop", one current waveform is on during "weak", and two current waveforms are on during "strong". Moreover, the method disclosed by PTL 1 also derives several clue conditions that one current waveform shifts from off to on when shifting from "stop" to "weak". The method disclosed by PTL 1 derives such a necessary condition and clue conditions in advance, and, when these conditions are satisfied a predetermined number of times or more, determines that an electric instrument is the same electric instrument, in estimation of the same electric instrument.

However, the method disclosed by PTL 1 previously requires information about an operation mode of an electric instrument, and about in which mode the electric instrument is on. Thus, when an operation mode in which an electric instrument is operating is not known in advance, the method disclosed by PTL 1 is not able to generate a necessary condition suited to an operation mode, and estimate that the electric instrument is the same electric instrument.

SUMMARY

An object of the present invention is to provide a classification device and the like being capable of classifying a current waveform of current estimated to be supplied to the same electric instrument, even when an operation mode of an operating electric instrument is unknown.

A classification computer of the present invention includes: a first classification unit configured to perform first classification of each piece of set information by information being included in each piece of the set information being a combination of waveform information and on/off information, and representing a similarity degree of the waveform information, the waveform information being separated from current information representing current supplied to an electric instrument, and representing a current waveform in a first period, the on/off information representing timings of supply start and supply stop of current having the current waveform in a second period; a second classification unit configured to perform second classification of each piece of the set information by information being included in each piece of the set information and representing a similarity degree of the on/off information; and a third classification unit configured to classify the set information by a classification result related to the first classification and the second classification.

A classification device and the like of the present invention are capable of classifying a current waveform of current estimated to be supplied to the same electric instrument, even when an operation mode of an operating electric instrument is unknown.

BRIEF DESCRIPTION OF THE DRAWINGS

Exemplary features and advantages of the present invention will become apparent from the following detailed description when taken with the accompanying drawings in which:

FIG. 4 is a conceptual diagram (No. 1) representing an example of a set information database (DB);

FIG. 7 is a conceptual diagram (No. 4) representing an example of a set information DB;

FIG. 11 is a conceptual diagram representing an example of processing performed by a set information classification unit.

EXAMPLE EMBODIMENT

Next, a detailed explanation will be given for a first example embodiment with reference to the drawings.

Figure 1:
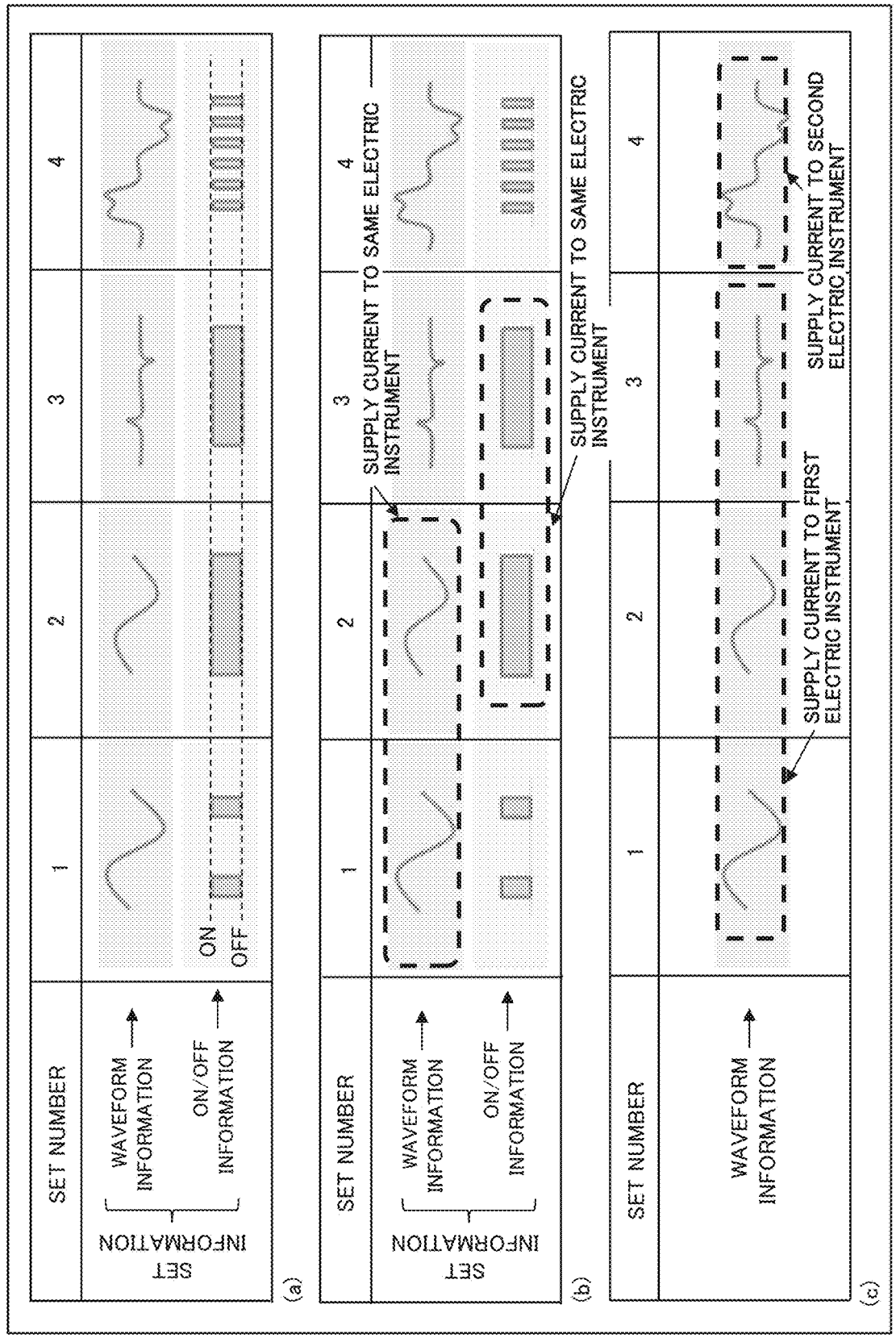
FIG. 1 is an image diagram representing an overview of an example of a classification operation performed by a classification device in a present example embodiment.

FIG. 1 is an image diagram representing an overview of an example of a classification operation performed by a classification device (see FIG. 3) in the present example embodiment. FIG. 1(*a*) represents each piece of set information before start of classification. FIG. 1(*b*) represents each of a set information classification result by waveform information and a set information classification result by on/off information. FIG. 1(*c*) represents a waveform information classification result by waveform information and on/off information.

Herein, as represented in FIG. 1(*a*), it is premised that, before the classification operation is performed, four pieces of set information are separated from a current waveform flowing from a switchboard to a device group by the NILM technique described in the section BACKGROUND ART. Set information is a combination of waveform information and on/off information. Herein, on/off information represents an on-timing at which supply of current having a waveform represented by waveform information to the device group is started, and an off-timing at which the supply is stopped. As described in the section BACKGROUND ART, waveform information separated by the NILM technique can include waveform information resulting from supply current to the same electric instrument. The classification device classifies waveform information for each supply to the same electric instrument.

In this instance, the classification device first classifies set information depending on whether or not waveform information is similar. In the example of FIG. 1(*b*), pieces of waveform information of set numbers 1 and 2 are similar to each other, and therefore, classified into waveform information of the same group representing supply current to the same electric instrument.

The above-described classification device also classifies on/off information depending on whether or not on/off information is similar. In the example of FIG. 1(*b*), pieces of on/off information of set numbers 2 and 3 are similar to each other, and therefore, classified into waveform information of the same group representing supply current to the same electric instrument.

Then, the above-described classification device classifies, into waveform information representing supply current to the same electric instrument, waveform information in which either waveform information or on/off information is classified into the same group. In the example of FIG. 1(*c*), pieces of waveform information of the set numbers 1, 2, and 3 are classified into waveform information representing supply current to a first electric instrument, and waveform information of a set number 4 is classified into waveform information representing supply current to a second electric instrument.

In this way, the classification device classifies waveform information for each electric instrument estimated to be a current supply destination, by determination of whether or not each of waveform information and on/off information is similar.

Hereinafter, details of set information and the classification device in the present example embodiment are described.

Figure 2:
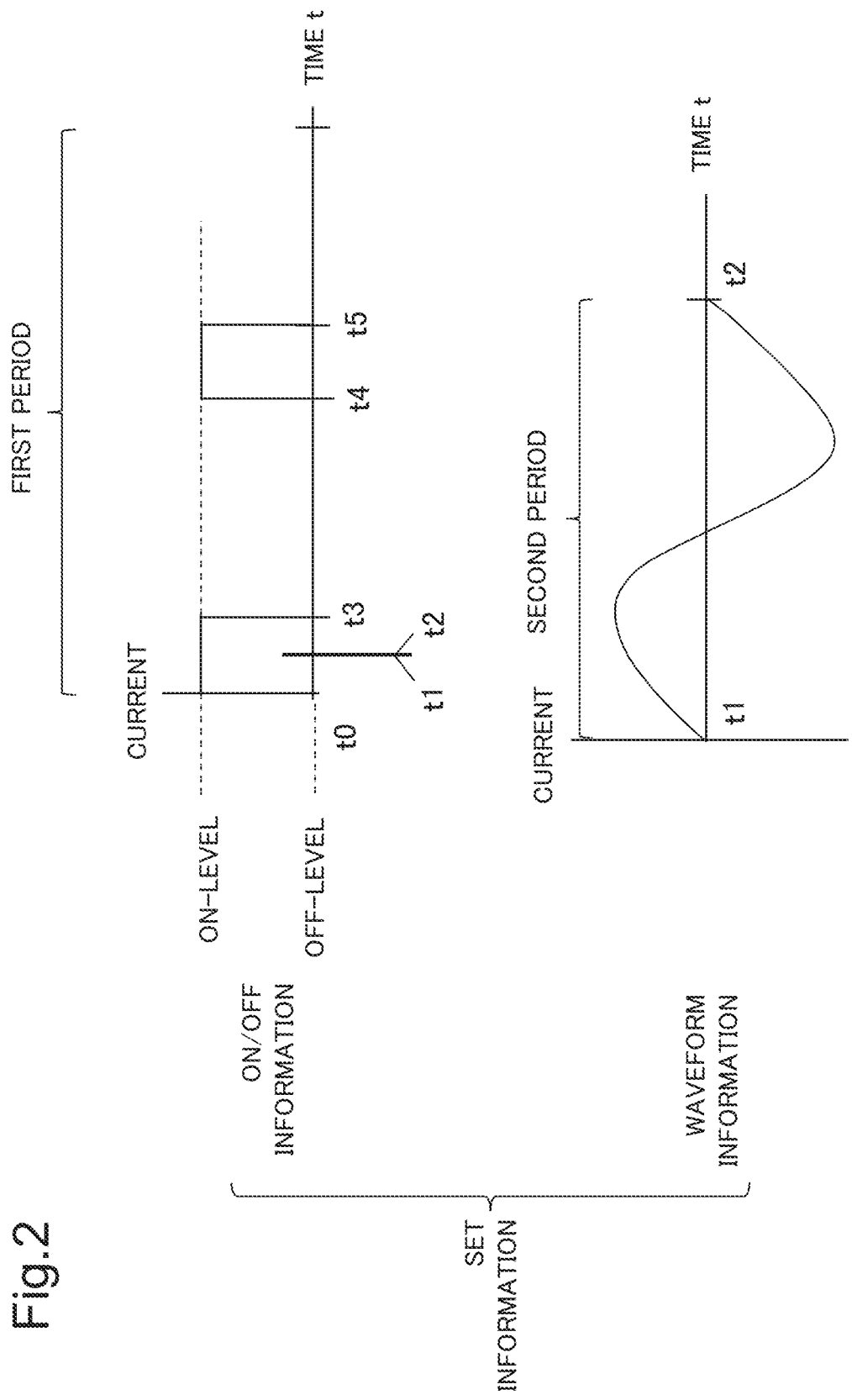
FIG. 2 is a conceptual diagram representing an example of set information targeted to be classified by the classification device in the present example embodiment.

FIG. 2 is a conceptual diagram representing an example of set information of a classification target for the classification device in the present example embodiment. Set information is information separated, by the NILM technique described in the section BACKGROUND ART, from current supplied from a switchboard or the like to a certain electric instrument group.

Set information is a combination of on/off information and waveform information.

On/off information is information representing a time of on or off regarding supply of current represented by waveform information, in a predetermined first period. Note that length and a start time of the first period may be any length and any start time without being limited to those represented in FIG. 2. Moreover, the classification device in the present example embodiment also targets a plurality of pieces of set information for classification. In that case, a start time and length of the first period of each piece of set information being a classification target are the same.

On the other hand, waveform information is information representing a waveform of supply current in a second period being a predetermined period in which on/off information is at an on-level. A start time and length of the second period are common to each piece of set information. Therefore, waveform information represents a waveform itself, and a phase related to the waveform. Waveform information in which a waveform itself is the same but a phase is different is another piece of waveform information.

Note that the NILM technique may not extract current waveforms of all electric instruments connected to a switchboard or the like from a current waveform supplied to an electric instrument group from the switchboard or the like. However, the classification device according to the present example embodiment does not question whether or not current waveforms of all electric instruments are extracted. The classification device in the present example embodiment performs classification regarding a current waveform extracted by the NILM technique.

Figure 3:
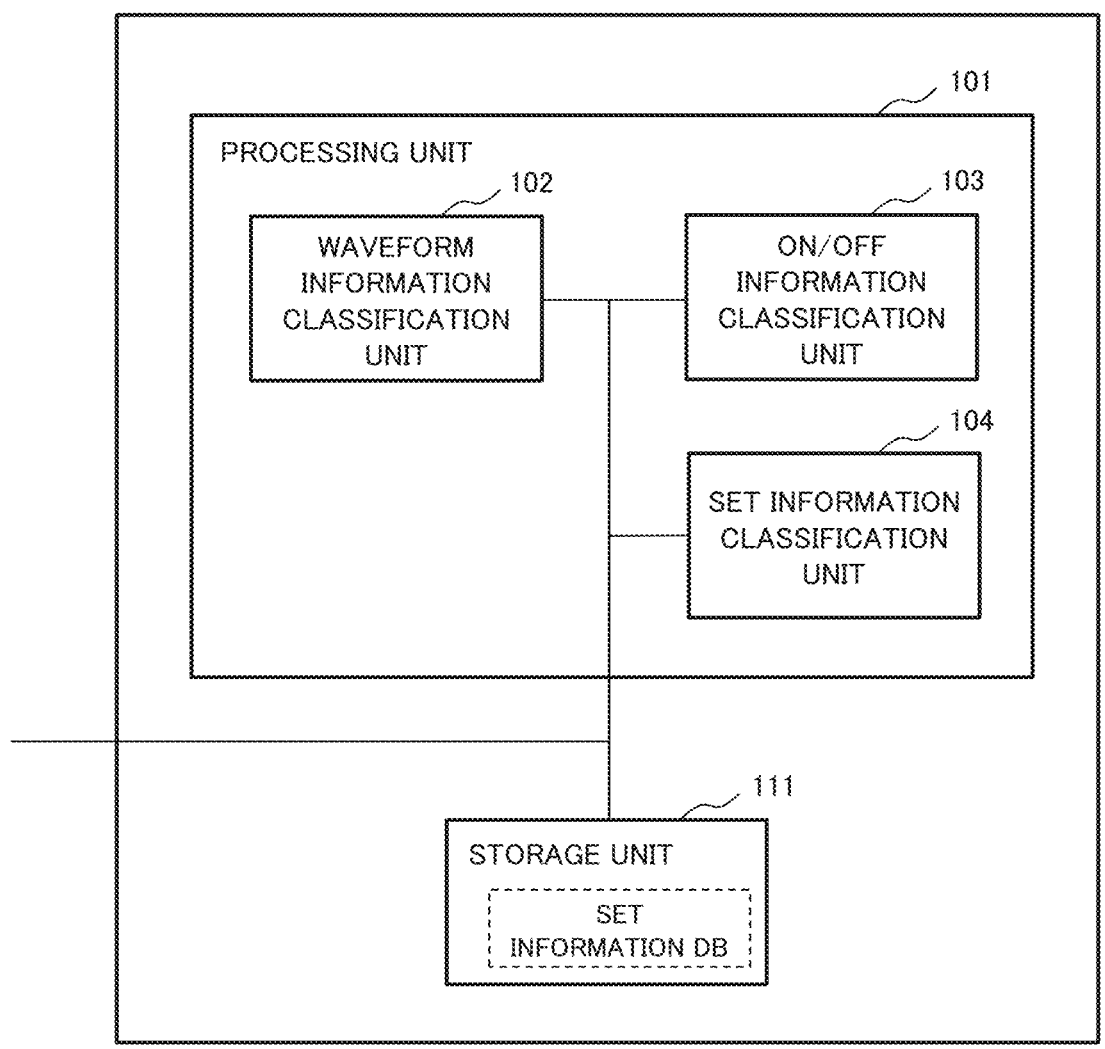
FIG. 3 is a conceptual diagram representing a configuration example of the classification device in the present example embodiment.

FIG. 3 is a conceptual diagram representing a configuration of a classification device 100 being an example of the classification device according to the present example embodiment.

The classification device 100 includes a processing unit 101 and a storage unit 111. The processing unit 101 includes a waveform information classification unit 102, an on/off information classification unit 103, and a set information classification unit 104.

The processing unit 101 is, for example, a processing device of a computer, such as a central processing unit.

The waveform information classification unit 102 classifies each piece of set information included in a set information database (DB) held by the storage unit 111, by similarity determination of pieces of waveform information of each piece of set information. When performing the similarity determination, the waveform information classification unit 102 acquires, for example, a similarity degree of two pieces of waveform information.

As the similarity degree, the waveform information classification unit 102 uses, for example, a first correlation coefficient derived by a method described next. The waveform information classification unit 102 first acquires an amplitude group including amplitude at each predetermined time included in the second period, regarding amplitude of two pieces of waveform information. Then, the waveform information classification unit 102 acquires the first correlation coefficient being a correlation coefficient between a first amplitude group related to first waveform information and a second amplitude group related to second waveform information, and designates the acquired first correlation coefficient as a similarity degree regarding waveform information.

In the above-described case, the waveform information classification unit 102 performs classification into the same group when the first correlation coefficient is equal to or more than a first threshold value. The first threshold value is, for example, 90%.

The waveform information classification unit 102 may perform classification of waveform information of each piece of set information by similarity determination, using a k-means method (see NPL 1) or a hierarchical clustering technique (see NPL 1).

Figure 5:
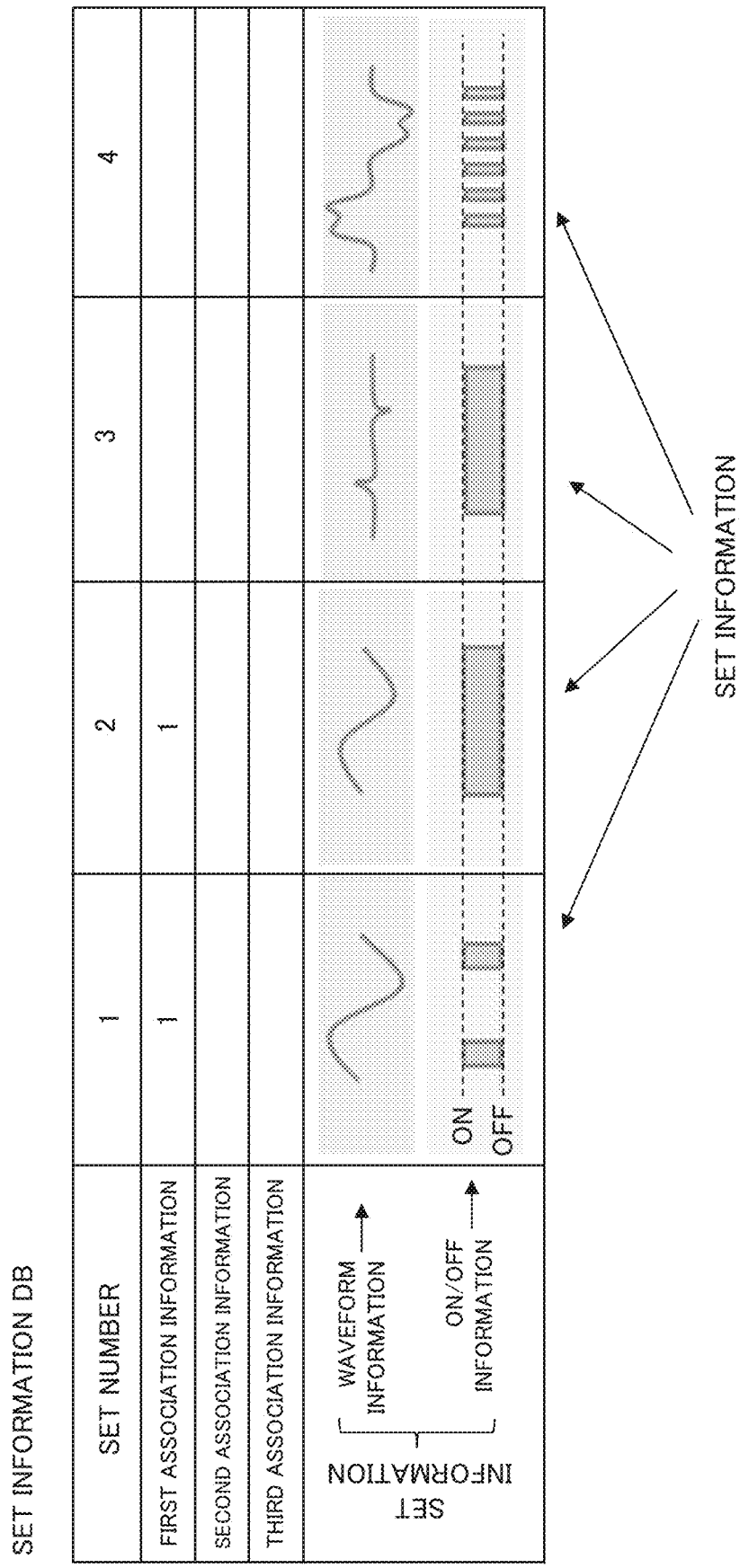
FIG. 5 is a conceptual diagram (No. 2) representing an example of a set information DB.
Figure 9:
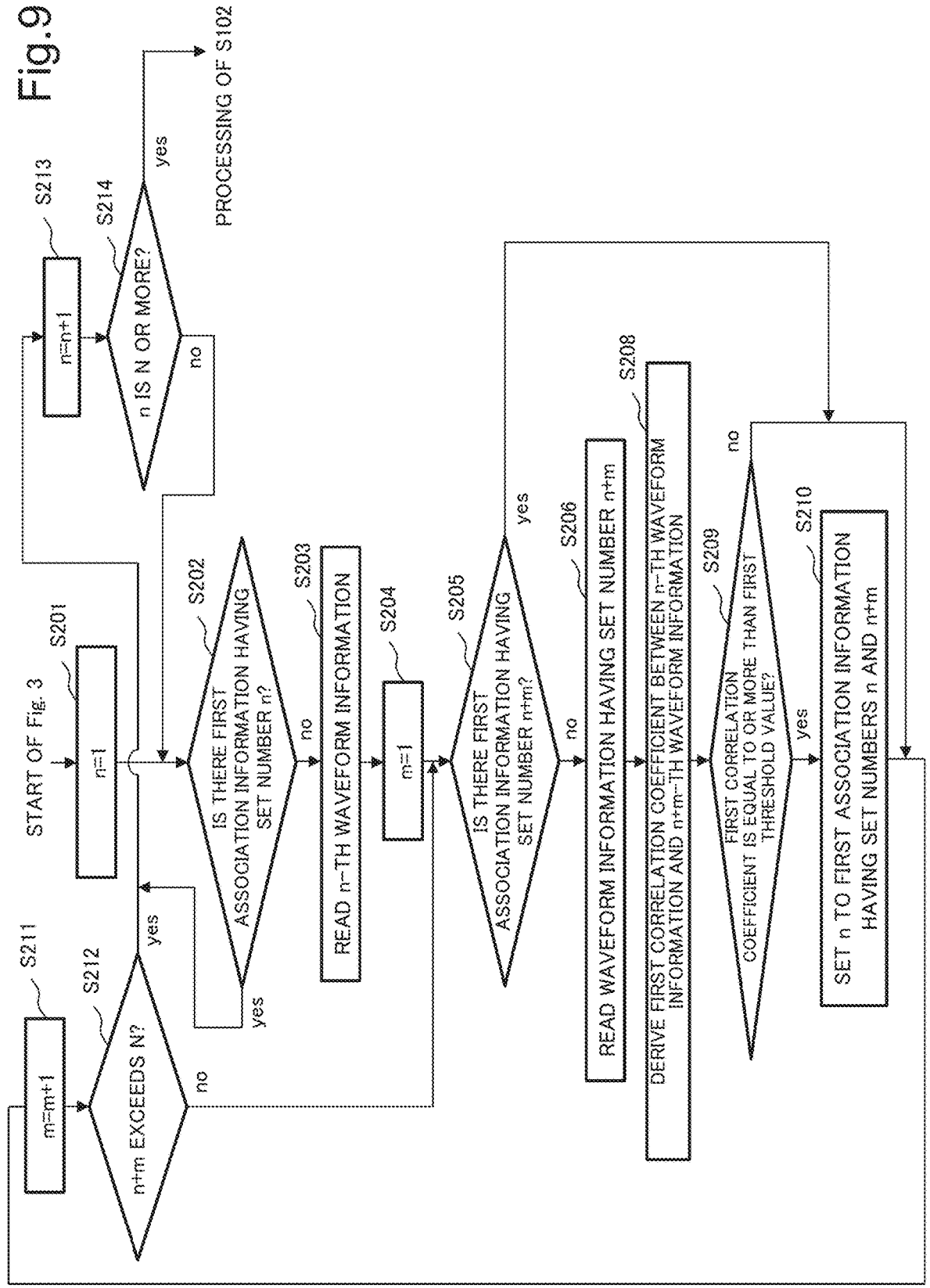
FIG. 9 is a conceptual diagram representing an example of processing performed by a waveform information classification unit.

A specific example of classification processing by similarity determination of waveform information of each piece of set information performed by the waveform information classification unit 102 is represented in FIG. 9. Moreover, an example of a classification result by the waveform information classification unit 102 is represented in FIG. 5.

The on/off information classification unit 103 classifies, by similarity determination of on/off information of each piece of set information, each piece of set information included in the set information DB held by the storage unit 111. When performing the similarity determination, the on/off information classification unit 103 acquires, for example, a similarity degree of two pieces of on/off information. As the similarity degree, the on/off information classification unit 103 derives, for example, a second correlation coefficient described next. The on/off information classification unit 103 first acquires an amplitude group including amplitude at each predetermined time included in the second period, regarding amplitude of two values of two pieces of waveform information. Then, the waveform information classification unit 102 acquires the second correlation coefficient being a correlation coefficient between a first amplitude group related to first on/off information and a second amplitude group related to second on/off information, and designates the acquired second correlation coefficient as a similarity degree regarding on/off information.

In the above-described case, the on/off information classification unit 103 performs classification into the same group when the second correlation coefficient is equal to or more than a second threshold value. The first threshold value is, for example, 90%.

The on/off information classification unit 103 may perform classification of on/off information of each piece of set information by similarity determination, or by a k-means method (see NPL 1) or a hierarchical clustering technique (see NPL 1). Herein, NPL 1 is, "Clustering" by Toshihiro Kamishima, [retrieved on Feb. 21, 2019], Internet (http://www.kamishima.net/archive/clustering.pdf).

Figure 6:
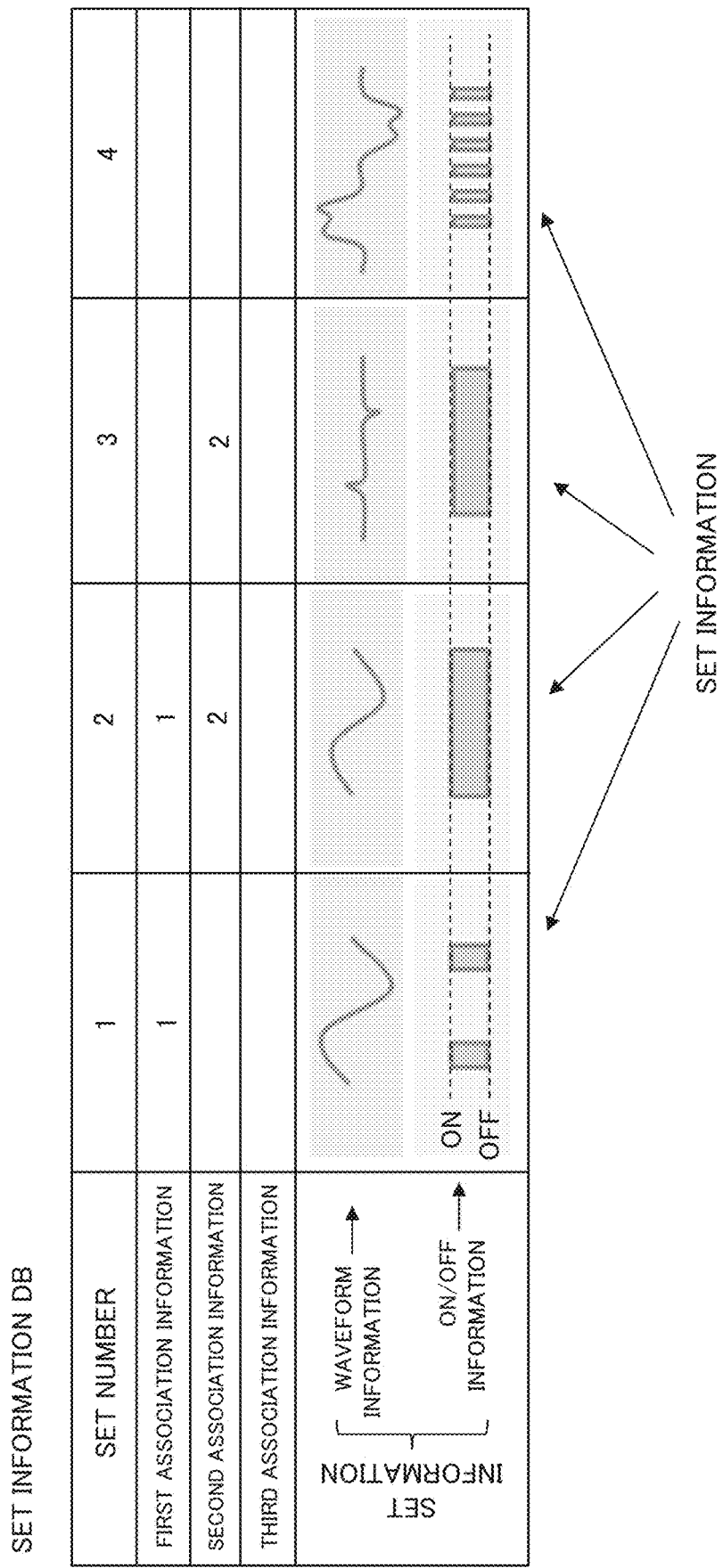
FIG. 6 is a conceptual diagram (No. 3) representing an example of a set information DB.
Figure 10:
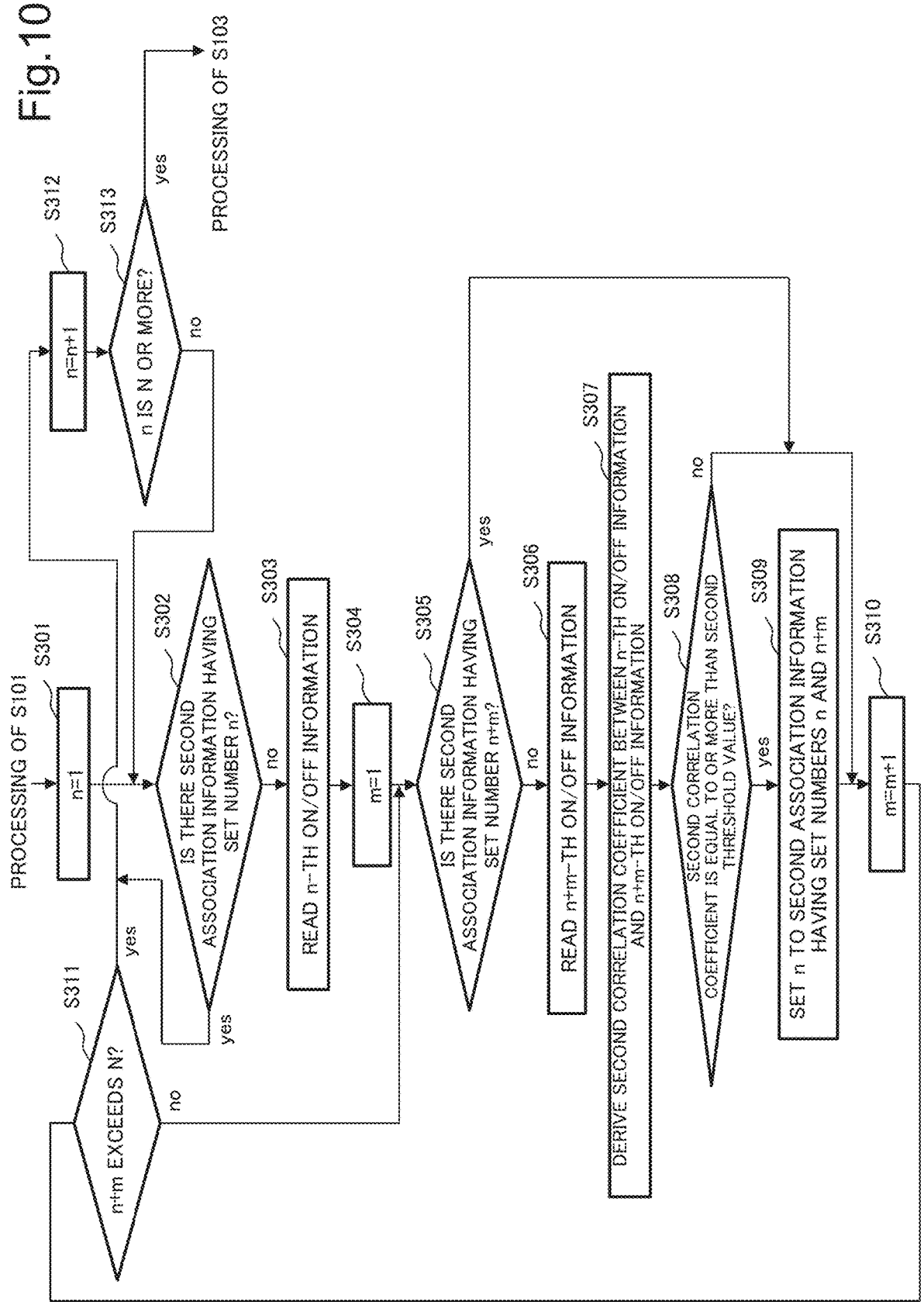
FIG. 10 is a conceptual diagram representing an example of processing performed by an on/off information classification unit.

A specific example of classification processing by similarity determination of on/off information of each piece of set information performed by the on/off information classification unit 103 is represented in FIG. 10. Moreover, an example of a classification result by the on/off information classification unit 103 is represented in FIG. 6.

The set information classification unit 104 classifies, into the same group, set information classified into the same group by either the waveform information classification unit 102 or the on/off information classification unit 103. It is estimated that an electric instrument which supplies current related to set information classified into the same group is the same.

A specific example of classification processing of each piece of set information performed by the set information classification unit 104 is represented in FIG. 11. Moreover, an example of a classification result by the set information classification unit 104 is represented in FIG. 7.

The storage unit 111 previously holds a set information database (DB) including set information. An example of a set information DB is described later with reference to each of FIGS. 4 to 7. The storage unit 111 also holds a program and information with which the processing unit 101 performs the operation described above. Moreover, the storage unit 111 stores information indicated by the processing unit 101. Further, the storage unit 111 sends, to the processing unit 101, storage information indicated by the processing unit 101.

FIG. 4 is a conceptual diagram representing an example of a set information DB represented in FIG. 3. The set information DB represented in FIG. 4 is a set information DB before classification of set information is started.

Each piece of set information includes a set number, a combination of waveform information and on/off information, and first to third association information. Contents of waveform information and on/off information are as described with reference to FIG. 2. Since the set information DB represented in FIG. 4 is a set information DB before classification of set information is started, a content of each piece of the first to third association information is blank.

FIG. 5 represents a set information DB after classification of set information by waveform information is performed. The set information DB stores 1 for the first association information of set information of the set numbers 1 and 2. The fact that the first association information of the set numbers 1 and 2 is 1 represents that set information of the set numbers 1 and 2 is in the same group.

FIG. 6 further represents a set information DB after classification of set information is performed by on/off information. The set information DB stores 2 for the second association information of set information of the set numbers 2 and 3.

FIG. 7 represents a set information DB after classification of set information is performed by the first association information and the second association information. As described above, the classification classifies, into the same group, set information to which either the first association information or the second association information is common. The set information DB stores 1 for the third association information of set information of the set numbers 1, 2 and 3. This represents that set information of the set numbers 1, 2, and 3 is in the same group.

Figure 8:
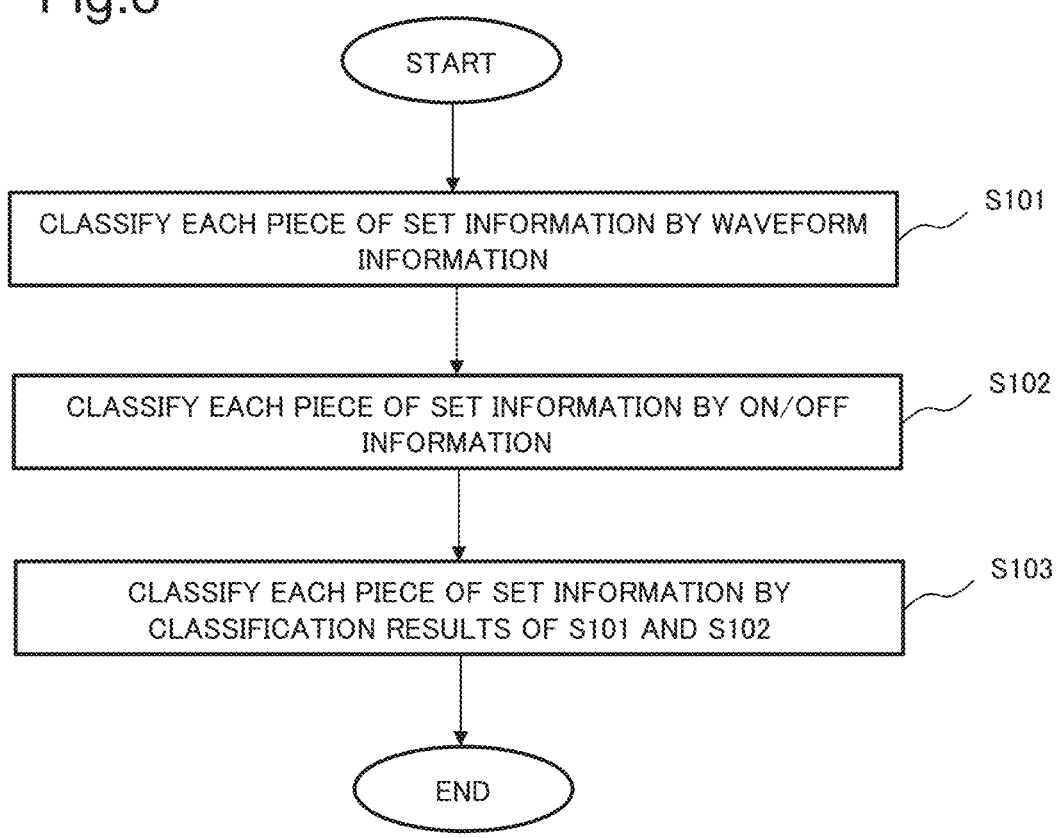
FIG. 8 is a conceptual diagram representing a processing flow example of processing performed by a processing unit.

FIG. 8 is a conceptual diagram representing a processing flow example of processing corresponding to the above-described operation performed by the processing unit 101 represented in FIG. 3.

The processing unit 101 starts processing represented in FIG. 8, for example, by input of start information from outside.

The processing unit 101 first classifies each piece of set information by waveform information, as processing of S101. The processing of S101 corresponds to the classification operation of set information by waveform information represented in FIG. 1(b). Moreover, the processing of S101 is performed by the waveform information classification unit 102. A detailed example of the processing of S101 is represented in FIG. 9. Further, a classification result example of set information by the processing of S101 is represented in FIG. 5.

Next, the processing unit 101 classifies each piece of set information by on/off information, as processing of S102. The processing of S101 corresponds to the classification operation of set information by on/off information represented in FIG. 1(b). Moreover, the processing of S102 is performed by the on/off information classification unit 103. A detailed example of the processing of S102 is represented in FIG. 10. Further, a classification result example of set information by the processing of S102 is represented in FIG. 6.

Next, as processing of S103, the processing unit 101 classifies each piece of set information, based on a classification result by the processing of S101 and a classification result by the processing of S102. In this instance, the processing unit 101 classifies, into the same group, set information classified into the same group in at least either the processing of S101 or the processing of S102. A classification result by the processing of S103 is as represented in, for example, FIG. 1(c). The processing of S103 is performed by the set information classification unit 104. A detailed example of the processing of S103 is represented in FIG. 11. Further, a classification result example of set information by the processing of S103 is represented in FIG. 7.

Then, the processing unit 101 ends the processing represented in FIG. 8.

FIG. 9 is a conceptual diagram representing a specific example of the processing of S101 performed by the waveform information classification unit 102 and represented in FIG. 8. FIG. 9 represents a processing example premising that the set information DB represented in FIG. 3 has a format similar to those represented in FIGS. 4 to 7.

When the processing represented in FIG. 8 is started by the processing unit 101, the waveform information classification unit 102 substitutes 1 for a value n representing a set number, as processing of S201. Herein, a set number is an identification number (see FIG. 4) being a sequence number given to each piece of set information in the set information DB stored in the storage unit 111.

Next, the waveform information classification unit 102 performs, as the processing of S202, determination regarding whether there is first association information relevant to n-th set information being set information of which set number is n. Herein, in the processing represented in FIG. 9, it is premised that set information is classified by first association information (see FIG. 5) given to set information. In other words, set information given the same first association information belongs to the same group. In FIG. 5, the same number 1 is stored in sections of first association information of the set numbers 1 and 2, and pieces of set information of the set numbers 1 and 2 are associated with each other. The processing of S202 is performed with an intention of not performing the processing of S203 to S212, regarding set information with which first association information is already associated.

The waveform information classification unit 102 performs processing of S213 when a determination result by the processing of S202 is yes.

On the other hand, the waveform information classification unit 102 performs processing of S203 when a determination result by the processing of S202 is no.

In the set information DB represented in FIG. 4, since there is no first association information in which a set number has a value n=1, a determination result by the processing of S202 when n=1 is no. Thus, the waveform information classification unit 102 performs the processing of S203.

When performing the processing of S203, the waveform information classification unit 102 reads, as the processing, n-th waveform information being waveform information of n-th set information.

Then, the waveform information classification unit 102 substitutes 1 for a value m, as processing of S204. Herein, the value m is a value used in processing of S205 to S208, and S210 to S212.

Then, the waveform information classification unit 102 performs, as the processing of S205, determination regarding whether there is first association information relevant to n+m-th set information. When the first association information is associated with the n+m-th set information, the processing of S205 is performed with an intention of not performing the processing of S207 to S212, regarding the m.

The waveform information classification unit 102 performs the processing of S206 when a determination result by the processing of S205 is no.

On the other hand, the waveform information classification unit 102 performs the processing of S211 when a determination result by the processing of S205 is yes.

In the set information DB represented in FIG. 4, when n=1 and m=1, there is no first association information having a set number n+m=2. Thus, a determination result by the processing of S205 when n=1 and m=1 becomes no. Therefore, the waveform information classification unit 102 performs the processing of S206.

When performing the processing of S206, the waveform information classification unit 102 reads, as the processing, n+m-th waveform information.

Then, the waveform information classification unit 102 derives a first correlation coefficient between the n-th waveform information and the n+m-th waveform information, as the processing of S208. A derivation method of the first correlation coefficient is as described in the description of FIG. 3.

Then, the waveform information classification unit 102 performs, as the processing of S209, determination regarding whether the first correlation coefficient derived by the processing of S208 is equal to or more than a first threshold value. The first threshold value is, for example, 90%.

The waveform information classification unit 102 performs the processing of S210 when a determination result by the processing of S209 is yes.

On the other hand, the waveform information classification unit 102 performs the processing of S211 when a determination result by the processing of S209 is no.

In the set information DB in FIG. 4, pieces of waveform information in which set numbers are a value n=1 and a value n+m=2 are similar, and the first correlation coefficient is calculated high. Thus, the determination result for n=1 and m=1 becomes yes. Accordingly, the waveform information classification unit 102 performs the processing of S210.

When performing the processing of S210, the waveform information classification unit 102 sets, as the processing, a value n to the first association information relevant to the n-th set information in which a set number has a value n, and the first association information relevant to the n+m-th set information in which a set number has a value n+m. In the set information DB represented in FIG. 5, as a result of the processing of S210 when n=1 and m=1, n=1 is stored in the first association information of each of first set information having a set number 1 and second set information having a set number 2.

Then, the waveform information classification unit 102 increases the value m by one, as the processing of S211.

Then, the waveform information classification unit 102 performs, as the processing of S212, determination regarding whether the value n+m exceeds a value N. Herein, the value N is a total number of pieces of set information stored in the storage unit 111. The fact that the value n+m exceeds the value N means that the n+m-th waveform information does not exist. Since there is no meaning in performing the processing of S205 to S211 regarding the nonexistent n+m-th waveform information, the processing of S212 is performed with an intention of shifting to processing of S213.

The waveform information classification unit 102 performs the processing of S213 when a determination result by the processing of S212 is yes.

On the other hand, the waveform information classification unit 102 again performs the processing of S205 when a determination result by the processing of S212 is no.

In the set information DB represented in FIG. 4, the value N being a total number of pieces of set information is 4. Moreover, when n=1 and m=1, n+m=2 is smaller than N. Therefore, a determination result by the processing of S212 when n=1 and m=1 becomes no. Accordingly, the waveform information classification unit 102 again performs the processing of S205.

Then, the waveform information classification unit 102 repeats the processing of S205 to S212 and sequentially increases the value of m by the processing of S211, and as a result, a determination result by the processing of S212 becomes yes. In this case, the waveform information classification unit 102 performs the processing of S213.

In this instance, the processing of S208 to S210 regarding all sets of the n-th waveform information and the n+m-th waveform information regarding the value n at this point is completed.

When performing the processing of S213, the waveform information classification unit 102 increases, as the processing, the value n by one.

Then, as processing of S214, the waveform information classification unit 102 determines whether the value n is the value N or more.

The waveform information classification unit 102 performs the processing of S102 in FIG. 8 when a determination result by the processing of S214 is yes.

On the other hand, the waveform information classification unit 102 again performs the processing of S202 when a determination result by the processing of S214 is no.

In the set information DB represented in FIG. 5, the value N being a total number of pieces of set information is 4. Therefore, a determination result by the processing of S214 when n=2 becomes no. Accordingly, the waveform information classification unit 102 again performs the processing of S202.

Then, the waveform information classification unit 102 repeats the processing of S202 to S214 and sequentially increases the value of n by the processing of S213, and as a result, a determination result by the processing of S214 becomes yes. In this case, the waveform information classification unit 102 performs the processing of S102.

The fact that a determination result by the processing of S214 is yes and the value n is N or more means that the n+m-th waveform information (m is 1 or more) does not exist. Since there is no meaning in performing the processing of S202 to S213 when the n+m-th waveform information does not exist, the operation shifts to the processing of S102 in FIG. 8.

Note that the processing of S208 to S210 is completed regarding all sets of two pieces of waveform information when a determination result by the processing of S214 becomes yes. In the set information DB in FIG. 5 representing this state, 1 is stored in the first association information in which set numbers are 1 and 2. The first association information is stored by the processing of S210 in which n=1 and m=1.

FIG. 10 is a conceptual diagram representing a specific example of the processing of S102 performed by the on/off information classification unit 103 and represented in FIG. 8. FIG. 10 represents a processing example premising that the set information DB represented in FIG. 3 has a format similar to those represented in FIGS. 4 to 7.

When the processing of S101 in FIG. 8 ends, the on/off information classification unit 103 substitutes 1 for the value n of a set number, as processing of S301. Herein, a set number is an identification number (see FIG. 4) being a sequence number given to each piece of set information stored in the storage unit 111, as in the case of FIG. 9.

Next, the on/off information classification unit 103 performs, as processing of S302, determination regarding whether there is second association information relevant to n-th set information being set information in which a set number is n. Herein, in the processing represented in FIG. 10, it is premised that the on/off information classification unit 103 classifies set information by second association information given to set information. In other words, set information given the same second association information is classified in such a way as to belong to the same group. An example of second association information is represented in FIG. 6. In FIG. 6, both pieces of second association information of the set numbers 2 and 3 are 2, and pieces of set information relevant to these set numbers are classified into the same group. Note that, when the second association information is already associated with the n-th set information, the processing of S302 is performed with an intention of not performing the processing of S303 to S311, regarding the n.

The on/off information classification unit 103 performs processing of S312 when a determination result by the processing of S302 is yes.

On the other hand, the on/off information classification unit 103 performs the processing of S303 when a determination result by the processing of S302 is no.

In the set information DB represented in FIG. 5, since there is no second association information in which a set number has a value n=1, a determination result by the processing of S302 when n=1 is no. Thus, the on/off information classification unit 103 performs the processing of S303.

When performing the processing of S303, the on/off information classification unit 103 reads, as the processing, n-th on/off information being on/off information of the n-th set information.

Then, the on/off information classification unit 103 substitutes 1 for a value m, as processing of S304. Herein, the value m is a value used in processing of S305 to S307, and S309 to S311.

Then, the on/off information classification unit 103 performs, as the processing of S305, determination regarding whether there is second association information relevant to n+m-th set information being set information in which a set number has a value n+m. When the second association information is associated with the n+m-th set information, the processing of S305 is performed with an intention of not performing the processing of S306 to S311 regarding the m.

The on/off information classification unit 103 performs the processing of S306 when a determination result by the processing of S305 is yes.

On the other hand, the on/off information classification unit 103 performs the processing of S310 when a determination result by the processing of S305 is no.

The set information DB represented in FIG. 5 does not store second association information having a set number n+m=2 (n=m=1). Thus, a determination result of S305 when n=1 and m=1 becomes no. Accordingly, the on/off information classification unit 103 performs the processing of S306.

When performing the processing of S306, the on/off information classification unit 103 reads, as the processing, n+m-th on/off information being on/off information in which a set number has a value n+m.

Then, the on/off information classification unit 103 derives a second correlation coefficient between the n-th on/off information and the n+m-th on/off information, as the processing of S307. The second correlation coefficient is as described in the description of FIG. 3.

Then, the on/off information classification unit 103 performs, as processing of S308, determination regarding whether the second correlation coefficient derived by the processing of S307 is equal to or more than a second threshold value. Herein, the second threshold value is a threshold value relating to a second correlation coefficient determined in advance for the processing of S308. The second threshold value is, for example, 90%.

The on/off information classification unit 103 performs the processing of S309 when a determination result by the processing of S308 is yes.

On the other hand, the on/off information classification unit 103 performs the processing of S310 when a determination result by the processing of S308 is no.

In the set information DB represented in FIG. 5, since on/off information in which a set number has a value n=1 is similar to on/off information in which a set number has a value n+1=2, the second correlation coefficient thereof is higher than the second threshold value. Thus, the determination result when n=1 and m=1 becomes no. Accordingly, the on/off information classification unit 103 performs the processing of S309.

When performing the processing of S309, the on/off information classification unit 103 sets, as the processing, n to the second association information relevant to the n-th set information and the second association information relevant to the n+m-th set information. For example, when the set information DB is in a state represented in FIG. 6, a value n=2 is stored in each piece of second association information in which set numbers have a value n=2 and a value n+m=3, by the processing of S309 in which n=2 and m=1. The fact that the value n+m exceeds the value N means that the n+m-th on/off information does not exist. Since there is no meaning in performing the processing of S305 to S311 regarding the nonexistent n+m-th on/off information, the processing of S311 is performed with an intention of shifting to the processing of S312.

Then, the on/off information classification unit 103 increases the value m by one, as the processing of S310.

Then, the on/off information classification unit 103 performs, as the processing of S311, determination regarding whether the value n+m exceeds a value N. Herein, the value N is a total number of pieces of set information stored in the set information DB of the storage unit 111.

The on/off information classification unit 103 performs the processing of S312 when a determination result by the processing of S311 is yes.

On the other hand, the on/off information classification unit 103 again performs the processing of S305 when a determination result by the processing of S311 is no.

In the set information DB represented in FIG. 5, since a total number of pieces of set information is N=4, a determination result by the processing of S311 in which n+m=2 (n=m=1) becomes no. Accordingly, the on/off information classification unit 103 again performs the processing of S305.

Then, the on/off information classification unit 103 repeats the processing of S305 to S311, increases the value of m by the processing of S310, and as a result, determines yes by the processing of S311. In this case, the on/off information classification unit 103 performs the processing of S312.

Note that the processing of S307 to S309 regarding all sets of the n-th on/off information and the n+m-th on/off information is completed when a determination result by the processing of S311 becomes yes.

When performing the processing of S312, the on/off information classification unit 103 increases, as the processing, the value n by one.

Then, as processing of S313, the on/off information classification unit 103 performs determination regarding whether the value n is the value N or more. The fact that the value n is N or more means that the n+m-th waveform information (m is 1 or more) does not exist. Since there is no meaning in performing the processing of S302 to S312 when the n+m-th waveform information does not exist, the operation shifts to the processing of S103 in FIG. 8.

The on/off information classification unit 103 performs the processing of S103 in FIG. 8 when a determination result by the processing of S313 is yes.

On the other hand, the on/off information classification unit 103 again performs the processing of S302 when a determination result by the processing of S313 is no.

In the set information DB in FIG. 5, since a total number of pieces of set information is N=4, a determination result by the processing of S313 in which n=2 becomes no. Then, the on/off information classification unit 103 again performs the processing of S302.

Then, the on/off information classification unit 103 repeats the processing of S302 to S313, increases the value of n by the processing of S312, and as a result, determines yes by the processing of S313. The processing of S307 to S309 is completed regarding all sets of two pieces of on/off information when a determination result by the processing of S313 becomes yes.

In the set information DB represented in FIG. 6 representing this state, a value of 2 is stored in the second association information in which set numbers are 2 and 3.

These pieces of second association information are stored by the processing of S309 in which n=2 and m=1.

FIG. 11 is a conceptual diagram representing a specific example of the processing of S103 performed by the set information classification unit 104 and represented in FIG. 8. FIG. 11 represents a processing example premising that the set information DB represented in FIG. 3 has a format similar to those represented in FIGS. 4 to 7.

In the processing represented in FIG. 11, first, when there are set numbers with which first association information and second association information are both associated, the second association information of each of the set numbers is set to the same contents as those of the first association information thereof (processing of S401 to S406). Then, the first association information and the second association information associated with each set number are designated as third association information of the set number (processing of S407 to S411). Consequently, set information with which the same third association information is associated is classified into the same group.

Hereinafter, details of FIG. 11 are described.

First, the set information classification unit 104 substitutes 1 for the value n of a set number, as processing of S401. Herein, a set number is an identification number (see FIG. 4) being a sequence number given to each piece of set information in the set information DB stored in the storage unit 111, as in the case of FIGS. 9 and 10.

Next, the set information classification unit 104 performs, as processing of S402, determination regarding whether there is first association information relevant to n-th set information being set information in which a set number is n. The processing of S402 is performed with an intention of not performing processing of S404 described later, regarding set information with which first association information is not associated.

The set information classification unit 104 performs processing of S403 when a determination result by the processing of S402 is yes.

On the other hand, the set information classification unit 104 performs processing of S405 when a determination result by the processing of S402 is no.

In the set information DB represented in FIG. 6, since there is first association information in which a set number has a value n=1, a determination result by the processing of S402 when n=1 becomes yes. Accordingly, the set information classification unit 104 performs the processing of S403.

When performing the processing of S403, the set information classification unit 104 performs, as the processing, determination regarding whether there is second association information relevant to n-th set information being set information in which a set number is n. The processing of S403 is performed with an intention of not performing the processing of S404 described later, regarding set information with which second association information is not associated.

The set information classification unit 104 performs the processing of S404 when a determination result by the processing of S403 is yes.

On the other hand, the set information classification unit 104 performs the processing of S405 when a determination result by the processing of S403 is no.

In the set information DB represented in FIG. 6, since there is no second association information in which a set number has a value n=1, a determination result by the processing of S403 when n=1 becomes no. Thus, the set information classification unit 104 performs the processing of S405.

When performing the processing of S404, the set information classification unit 104 replaces, as the processing, with first association information described as follows, each piece of second association information being equal to second association information determined to be associated in a process of the processing of S403. In other words, the first association information is first association information determined to be associated in a process of the processing of S402.

Then, the set information classification unit 104 increases the value n by one, as the processing of S405.

Then, as processing of S406, the set information classification unit 104 performs determination regarding whether the value n is the value N or more. The fact that the value n is N or more means that the processing of S402 to S406 is ended regarding all the values n, and therefore, the operation shifts to processing of S407.

The set information classification unit 104 performs the processing of S407 when a determination result by the processing of S406 is yes.

On the other hand, the set information classification unit 104 again performs the processing of S402 when a determination result by the processing of S406 is no.

In the set information DB represented in FIG. 7, since a total number of pieces of set information is N=4, a determination result by the processing of S406 in which n=3 becomes no. Then, the set information classification unit 104 again performs the processing of S402.

Then, the set information classification unit 104 repeats the processing of S402 to S406, increases the value of n by the processing of S405, and as a result, determines yes by the processing of S406. In this case, the set information classification unit 104 performs the processing of S407.

Note that, in a case where, when a determination result by the processing of S406 becomes yes, there is a set number with which first association information and second association information are both stored, the second association information of another set number equal to the second association information is replaced with first association information.

In the set information DB represented in FIG. 7, second association information of the set numbers 2 and 3 having a value of 2 in the set information DB represented in FIG. 6 is replaced with a value of 1. These pieces of second association information have 2 replaced with 1 in the processing of S404 in which n=2.

When performing the processing of S407, the set information classification unit 104 substitutes, as the processing, 1 for the value n.

Then, the set information classification unit 104 performs, as processing of S408, determination regarding whether there is first association information or second association information associated with the n-th set information.

The set information classification unit 104 performs processing of S409 when a determination result by the processing of S408 is yes.

On the other hand, the set information classification unit 104 performs the processing of S410 when a determination result by the processing of S408 is no.

For example, when the set information DB is in a state represented in FIG. 7, there is first association information in which a set number has a value n=1, and therefore, a determination result by the processing of S408 when n=1 becomes yes. Accordingly, the set information classification unit 104 performs the processing of S409.

When performing the processing of S409, the set information classification unit 104 sets, as the processing, to third association information, first association information or second association information determined to be associated in a process of the processing of S409. For example, when the set information DB is in a state represented in FIG. 7, 1 being a value of first or second association information is stored in third association information of the set numbers 1 to 3 by the processing of S409 in which n=1 to 3.

Then, the set information classification unit 104 increases the value n by one, as the processing of S410.

Then, as processing of S411, the set information classification unit 104 performs determination regarding whether the value n is the value N or more.

The set information classification unit 104 ends the processing represented in FIG. 8 when a determination result by the processing of S411 is yes.

On the other hand, the set information classification unit 104 again performs the processing of S408 when a determination result by the processing of S411 is no.

In the set information DB in FIG. 7, since a total number of pieces of set information is N=4, a determination result by the processing of S411 in which n=1 becomes no. Thus, the set information classification unit 104 again performs the processing of S408. Then, the set information classification unit 104 repeats the processing of S408 to S411, increases the value of n by the processing of S410, and as a result, determines yes by the processing of S411.

Then, the set information classification unit 104 ends the processing represented in FIG. 8. The fact that the value n is N or more means that the processing of S408 to S409 is ended regarding all the values n, and therefore, the processing in FIG. 8 is ended.

Note that, in the set information DB at a point where a determination result of S411 becomes yes, a value being equal to first association information or second association information is stored in third association information of all set numbers with which first association information or second association information is stored. In the set information DB represented in FIG. 7 at the point, 1 is stored in each piece of third association information of the set numbers 1 to 3. These are stored by the processing of S409 for each of the set numbers n=1 to 3.

Advantageous Effect

The classification device in the present example embodiment performs classification of bringing, into the same group, combinations in which either waveform information or on/off information is similar, among combinations of waveform information and on/off information extracted from a supplied current waveform by the NILM technique. Herein, waveform information is information representing a waveform and a phase. Therefore, the fact that waveform information is similar represents, with a high possibility, that the waveform information relates to current supplied to the same electric instrument. Moreover, on/off information is information representing on/off of supplied current having the current waveform. Therefore, the fact that on/off information is similar represents, with a high possibility, that the on/off information relates to current supplied to the same electric instrument. Accordingly, the above-described classification device is capable of performing classification, for each electric instrument, of set information of waveform information and on/off information extracted by the NILM technique, by performing the above-described classification of bringing, into the same group, set information in which either waveform information or on/off information is similar. The classification device in the present example embodiment performs classification of set information for each electric instrument by similarity determination of each of waveform information and on/off information in this way, and therefore, does not require, for the classification, information relating to an operation mode of an operating electric instrument. Therefore, the classification device in the present example embodiment is capable of classifying a current waveform estimated to be supplied to the same electric instrument, even when an operation mode of an operating electric instrument is unknown.

Figure 12:
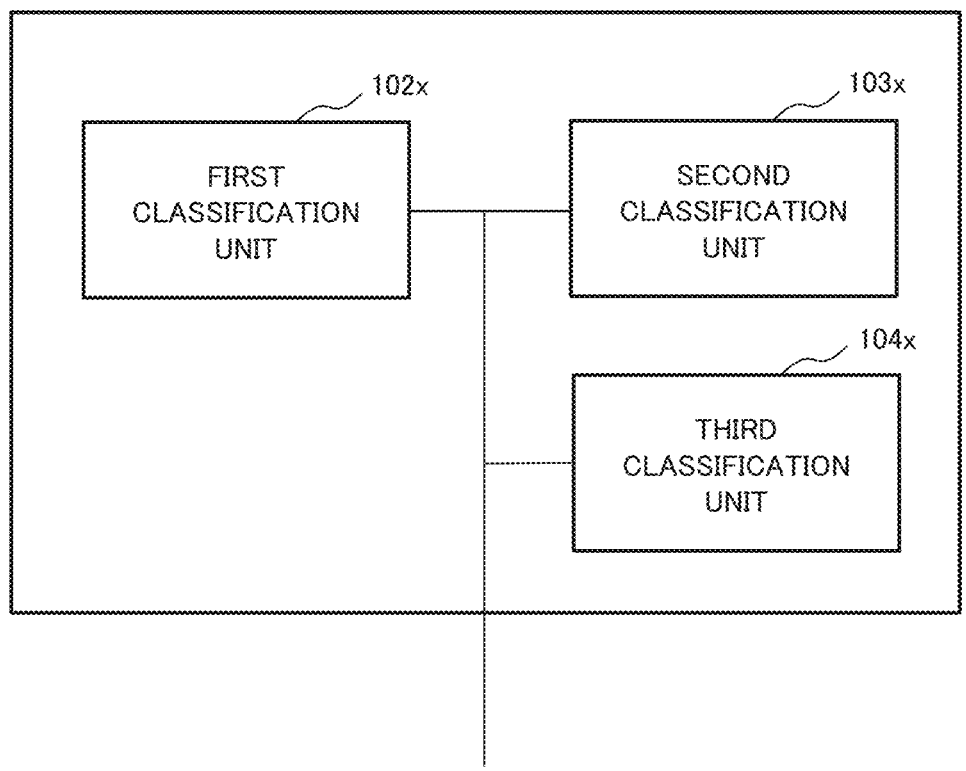
FIG. 12 is a block diagram representing a minimum configuration of a classification device in an example embodiment.

FIG. 12 is a block diagram representing a configuration of a classification device 101x being a minimum configuration of a classification device in an example embodiment.

The classification device 101x includes a first classification unit 102x, a second classification unit 103x, and a third classification unit 104x. The first classification unit 102x performs first classification of each piece of set information by information included in each piece of the set information that is a combination of waveform information and on/off information, and representing a similarity degree of the waveform information. Herein, the waveform information is information separated from current information representing current supplied to an electric instrument, and representing a current waveform in a first period. Moreover, the on/off information is information representing timings of supply start and supply stop of current having the current waveform in a second period.

The second classification unit 103x performs second classification of each piece of set information by information included in each piece of the set information and representing a similarity degree of the on/off information.

The third classification unit 104x classifies the set information by a classification result related to the first classification and the second classification.

The waveform information represents a waveform in a determined first period, and therefore, is information representing a waveform and a phase. Therefore, the fact that waveform information is similar represents, with a high possibility, that the waveform information relates to current supplied to the same electric instrument. Moreover, the on/off information is information representing on/off of supplied current having the current waveform. Therefore, the fact that on/off information is similar represents, with a high possibility, that the on/off information relates to current supplied to the same electric instrument. Accordingly, the above-described classification device is capable of performing classification of the set information for each electric instrument, by performing the above-described classification of bringing, into the same group, set information in which either waveform information or on/off information is similar. The classification device 101x performs classification of set information for each electric instrument depending on a degree of similarity of each of waveform information and on/off information, and therefore, does not require, for the classification, information relating to an operation mode of an operating electric instrument. Therefore, the classification device 101x is capable of classifying a current waveform estimated to be supplied to the same electric instrument, even when an operation mode of an operating electric instrument is unknown.

Thus, the classification device 101x provides, by the above-described configuration, an advantageous effect described in the section of Advantageous Effect.

Note that the classification device 101x represented in FIG. 12 is, for example, the classification device 100 represented in FIG. 3.

Further, the first classification unit 102x is, for example, the waveform information classification unit 102 represented in FIG. 2.

Further, the second classification unit 103x is, for example, the on/off information classification unit 103.

Further, the third classification unit 104x is, for example, the set information classification unit 104.

While each example embodiment of the present invention has been described above, the present invention is not limited to the example embodiments described above, and a further modification, substitution, or adjustment can be made without departing from the basic technical concept of the present invention. For example, a configuration of an element illustrated in each drawing is one example for assisting understanding of the present invention, and is not limited to the configuration illustrated in each of these drawings.

REFERENCE SIGNS LIST 100, 101x Classification device
101 Processing unit
102 Waveform information classification unit
102x First classification unit
103 On/off information classification unit
103x Second classification unit
104 Set information classification unit
104x Third classification unit
111 Storage unit The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

The invention claimed is:

1. A classification computer for checking a working status of each electric instrument, the classification computer comprising:
a memory storing instructions; and
a processor configured to execute the instructions to implement:
a first classification unit configured to perform first classification of each piece of set information by information being included in each piece of the set information being a combination of waveform information and on/off information, and representing a similarity degree of the waveform information, the waveform information being separated from current information representing current supplied to an electric instrument, and representing a current waveform in a first period, the on/off information representing timings of supply start and supply stop of current having the current waveform in a second period;
a second classification unit configured to perform second classification of each piece of the set information by information being included in each piece of the set information and representing a similarity degree of the on/off information; and
a third classification unit configured to classify the set information by a classification result related to the first classification and the second classification.

2. The classification computer according to claim 1, wherein information representing a similarity degree of the waveform information is a first correlation coefficient being a correlation coefficient regarding an amplitude group including amplitude of a waveform at each predetermined time in the second period, regarding first waveform information being the waveform information of first set information selected from the set information, and second waveform information being the waveform information of second set information selected from the set information.

3. The classification computer according to claim 2, wherein the first classification unit is configured to classify the first set information and the second set information into a same group when the first correlation coefficient is equal to or more than a first threshold value.

4. The classification computer according to claim 1, wherein information representing a similarity degree of the on/off information is a second correlation coefficient being a correlation coefficient regarding a level group including a level of the on/off information at each predetermined time in the first period, regarding first on/off information being the on/off information of third set information selected from the set information, and second on/off information being the on/off information of fourth set information selected from the set information.

5. The classification computer according to claim 4, wherein the second classification unit is configured to classify the third set information and the fourth set information into a same group when the second correlation coefficient is equal to or more than a second threshold value.

6. The classification computer according to claim 1, wherein the third classification unit is configured to classify, into a same group, the set information classified into a same group by either the first classification unit or the second classification unit.

7. The classification computer according to claim 1, wherein the first classification unit is further configured to separate the waveform information from the current information.

8. The classification computer according to claim 1, wherein the processor is further configured to execute the instructions to implement an extraction unit configured to extract the waveform information from a supply current waveform provided to an electric instrument group from a switchboard.

9. A classification method for checking a working status of each electric instrument, the classification method comprising:
performing first classification of each piece of set information by information being included in each piece of the set information being a combination of waveform information and on/off information, and representing a similarity degree of the waveform information, the waveform information being separated from current information representing current supplied to an electric instrument, and representing one or more current waveforms in a first period, the on/off information representing timings of supply start and supply stop of current having the current waveform in a second period;

performing second classification of each piece of the set information by information being included in each piece of the set information and representing a similarity degree of the on/off information; and classifying the set information by a classification result related to the first classification and the second classification.

10. A computer-readable non-transitory recording medium recording a classification program for checking a working status of each electric instrument, the classification program causing a computer to implement:

processing of performing first classification of each piece of set information by information being included in each piece of the set information being a combination of waveform information and on/off information, and representing a similarity degree of the waveform information, the waveform information being separated from current information representing current supplied to an electric instrument, and representing one or more current waveforms in a first period, the on/off information representing timings of supply start and supply stop of current having the current waveform in a second period;

processing of performing second classification of each piece of the set information by information being included in each piece of the set information and representing a similarity degree of the on/off information; and processing of classifying the set information by a classification result related to the first classification and the second classification.

* * * * *